United States Patent [19]
Woo

[11] Patent Number: 5,229,631
[45] Date of Patent: Jul. 20, 1993

[54] ERASE PERFORMANCE IMPROVEMENT VIA DUAL FLOATING GATE PROCESSING

[75] Inventor: Been-Jon Woo, Saratoga, Calif.

[73] Assignee: Intel Corporation, Santa Clara, Calif.

[21] Appl. No.: 963,938

[22] Filed: Oct. 20, 1992

Related U.S. Application Data

[60] Continuation of Ser. No. 778,580, Oct. 17, 1991, abandoned, which is a division of Ser. No. 567,606, Aug. 15, 1990.

[51] Int. Cl.$^5$ .................. H01L 11/40; H01L 27/02
[52] U.S. Cl. ................... 257/314; 257/316; 257/321; 257/315
[58] Field of Search ............. 357/23.5; 257/314, 316, 257/315, 321

[56] References Cited

U.S. PATENT DOCUMENTS

| | | | |
|---|---|---|---|
| 4,365,405 | 12/1982 | Dickman et al. | |
| 4,517,732 | 5/1985 | Oshikawa . | |
| 4,597,159 | 7/1986 | Usami et al. | |
| 4,701,776 | 10/1987 | Perlegos et al. | 357/23.5 |
| 4,719,184 | 1/1988 | Cantarelli et al. | 357/23.5 |
| 4,742,491 | 5/1988 | Liang et al. | |
| 4,766,473 | 8/1988 | Kuo | 357/23.5 |
| 4,768,080 | 8/1988 | Sato | 357/23.5 |
| 4,812,885 | 3/1989 | Riemenschneider | 357/23.5 |
| 4,926,222 | 5/1990 | Kosa et al. | 357/23.5 |
| 4,957,877 | 9/1990 | Tam et al. | |
| 4,966,572 | 10/1990 | Tanaka et al. | 357/23.5 |
| 4,994,403 | 2/1991 | Gill | 357/23.5 |
| 5,008,722 | 4/1991 | Esquivel | 357/23.5 |
| 5,028,979 | 7/1991 | Mazzali | 357/23.5 |
| 5,063,423 | 11/1991 | Fujii et al. | 357/23.5 |

FOREIGN PATENT DOCUMENTS

| | | |
|---|---|---|
| 53-89686 | 8/1978 | Japan . |
| 57-66675 | 4/1982 | Japan . |
| 57-87176 | 5/1982 | Japan . |
| 60-10679 | 1/1985 | Japan . |
| 61-181168 | 8/1986 | Japan . |
| 61-255071 | 11/1986 | Japan . |
| 1-132169 | 5/1989 | Japan . |

*Primary Examiner*—Eugene R. LaRoche
*Assistant Examiner*—Viet Q. Nguyen
*Attorney, Agent, or Firm*—Blakely, Sokoloff, Taylor & Zafman

[57] ABSTRACT

A process for fabricating floating gates for electrically programmable and electrically erasable memory cells of the flash EPROM or EEPROM type. The floating gates are a three layer structure. The first layer of the floating gate is a thin polysilicon layer of approximately 300–500 Å thickness. The second layer is a silicon dioxide layer of approximately 20–30 Å. The third layer is polysilicon of approximately 1000–1500 Å thickness. The third layer is doped by implantation of phosphorous. This dopant is driven through the oxide layer to dope the first, thin polysilicon layer in a separate diffusion step or in subsequent high temperature processing. The grain size of the first, thin polysilicon layer is small and uniform from gate to gate due to the thinness of this layer and its light doping. This reduces variations in threshold voltage from gate to gate due to variable polysilicon grain size and orientation. This in turn results in improved yield and cycling endurance.

16 Claims, 3 Drawing Sheets

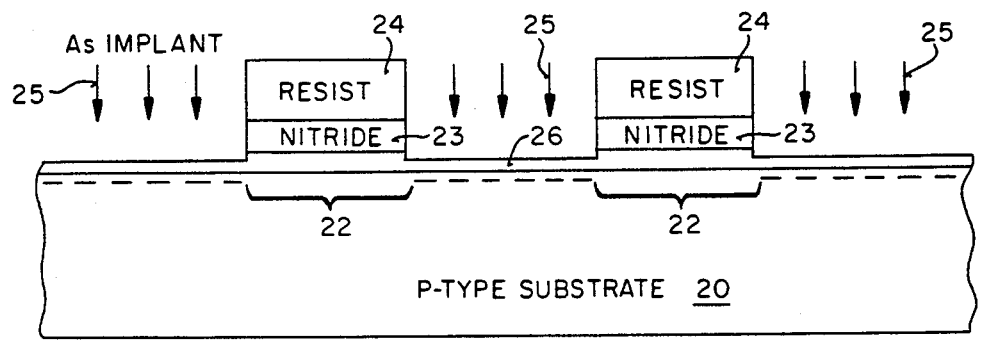
FIG_1
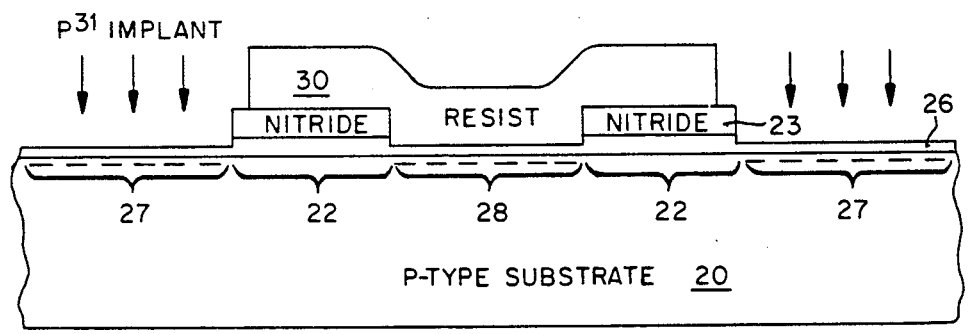
FIG_2
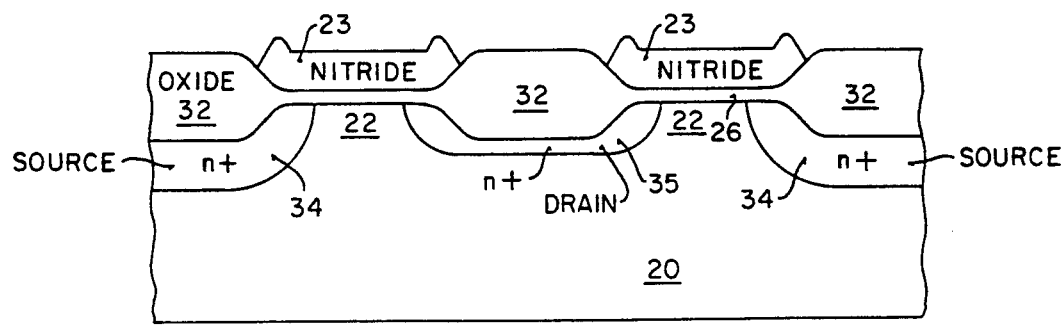
FIG_3

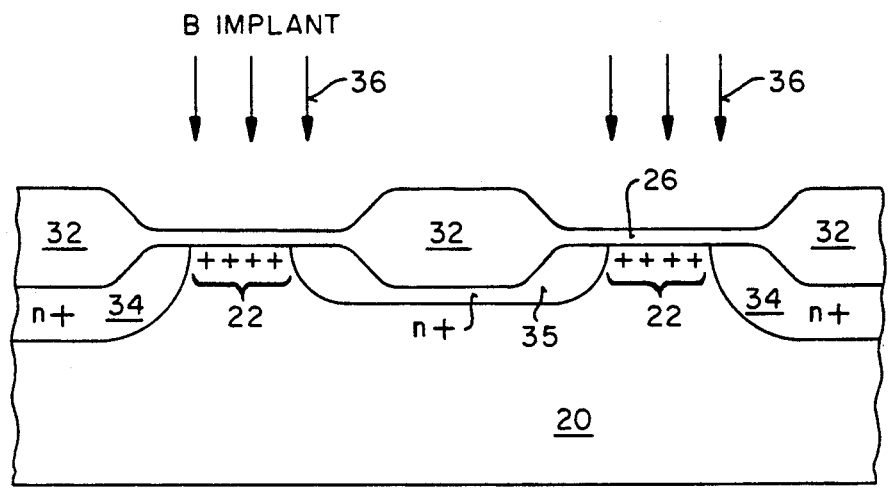
FIG_4
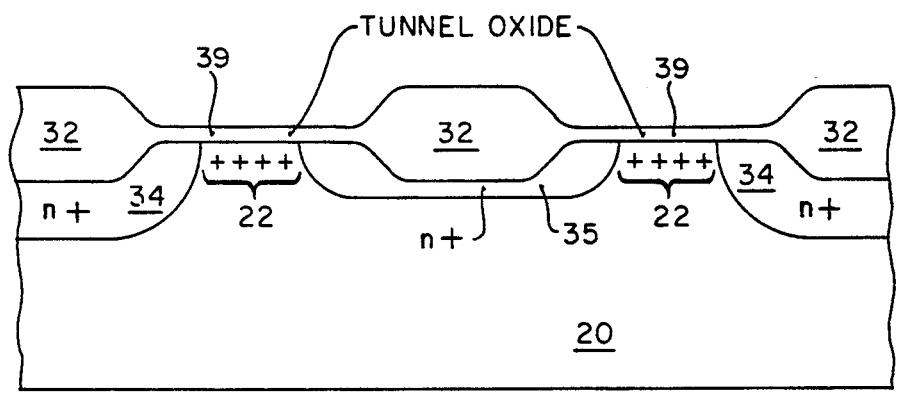
FIG_5
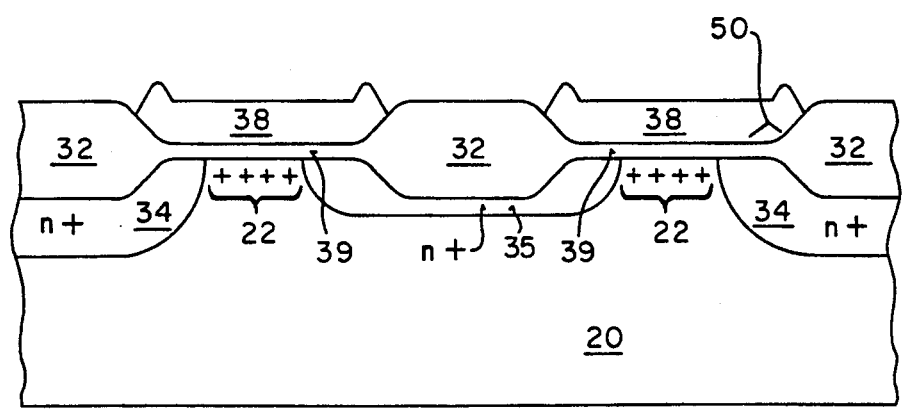
FIG_6 (PRIOR ART)

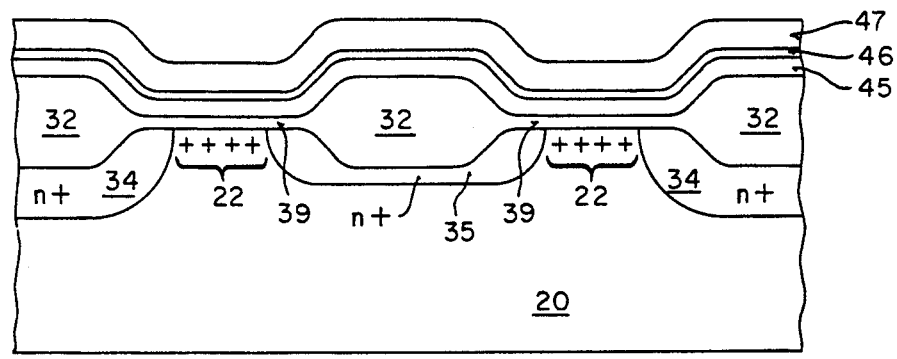
FIG_7
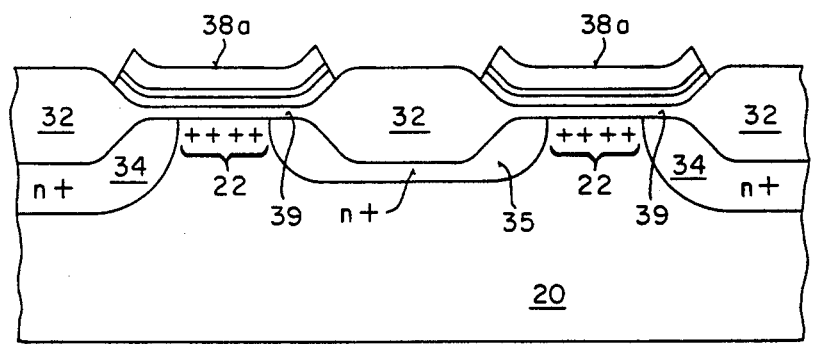
FIG_8
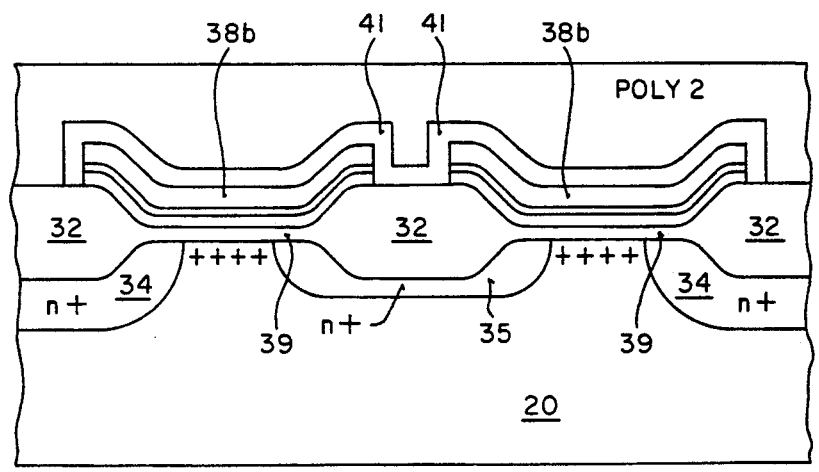
FIG_9

ERASE PERFORMANCE IMPROVEMENT VIA DUAL FLOATING GATE PROCESSING

This is a continuation of application Ser. No. 07/778,580, filed Oct. 17, 1991, abandoned, which is a divisional of application Ser. No. 07/567,606, filed Aug. 15, 1990.

BACKGROUND OF THE PRESENT INVENTION

1. Field of the Invention

The invention relates to the field of semiconductor memory devices employing floating gates and the processes and methods for fabricating these devices.

2. Prior Art

One class of non-volatile semiconductor memories employs floating gates, that is, gates which are completely surrounded by an insulative layer such as silicon dioxide. Typically, a polycrystalline silicon (polysilicon) layer is used to form floating gates. These gates are electrically charged, most often with electrons by transferring charge into and from the gates through a variety of mechanisms. The presence of absence of this charge represents stored, binary information. An early example of such a device is shown in U.S. Pat. No. 3,500,142.

The earliest commercial electrically programmable read-only memories (EPROMs) employing floating gates used p-channel devices which are programmed through avalanche injection. Charge is removed from these devices by exposing the array to electromagnetic radiation such as ultraviolet light (see U.S. Pat. No. 3,660,819). Later, EPROMs used n-channel devices and relied on channel injection as the mechanism for transferring charge into the floating gates (see U.S. Pat. No. 3,984,822). Many EPROMs fabricated with current technology still rely on channel injection for transferring charge into the floating gates and radiation for erasing the gates.

Another category of semiconductor floating gate memory devices are both electrically programmable and electrically erasable. Such a device is shown in U.S. Pat. No. 4,203,158. Tunneling through a thin oxide region transfers charge into and from the floating gates. In these memories, two devices are required for each memory cell. One device includes the floating gate and the other (typically an ordinary field-effect transistor) is used to isolate the floating gate device during various memory cycles.

A more recent category of floating gate memory devices uses channel injection for charging floating gates and tunneling for removing charge from the gates. Here, each memory cell comprises only a single device and the entire memory array is erased at one time, that is, individual cells or groups of cells are not separately erasable as in current EEPROMs. These memories are sometimes referred to as "flash" EPROMs or EEPROMs.

In non-volatile memories, the programming and erasing functions occur through the tunnel oxide. In a device using the tunnel injection mechanism to erase, approximately 10 through 15 volts are applied to the source while the drain regions are floating and the control gates are grounded. During erase, electrons tunnel from the floating gate to the source from the tunnel oxide.

The relative ease with which electrons can tunnel through the tunnel oxide depends on several factors including tunnel oxide thickness, tunnel oxide quality, floating gate doping, floating gate polysilicon grain size and grain orientation, among other factors.

Electrons will tunnel at lower voltages when the grains are oriented such that sharp points are present near the floating gate/tunnel oxide interface then when there are no sharp points of the grains near the floating gate/tunnel oxide interface since edges and sharp points distort the electric field by causing it to be greater in the localized region of the edges and sharp points. In polysilicon gates with large polysilicon grain size, the variations in required erase voltages from cell to cell are large as the electric field distortion is great with large grains and there are fewer such grains in the tunnel region so that the orientation of these few grains has a large impact on the erase voltage. If there is a large variation from cell to cell in an array of such devices, those floating gates which erase faster to a verified voltage at the same erase condition are know as "tail bits". The existence of the tail bits limits both yield and cycling endurance.

What is needed is a process which forms a polysilicon floating gate with small, uniform grain sizes near the floating gate/tunnel oxide interface so that the erase voltages are thereby uniform from cell to cell and chip yield and cycling endurance is thereby increased.

SUMMARY OF THE INVENTION

A process for fabricating electrically programmable and electrically erasable floating gate memory devices is described. The floating gates formed by the process of the present invention have small, uniform grain size at the floating gate-tunnel oxide interface.

A first thin polysilicon layer is deposited using conventional techniques. The thickness of this first polysilicon layer is approximately 300–500 Å. Next, a thin oxide of approximately 20–30 Å is grown on the thin polysilicon layer. Finally, a second polysilicon layer of about 1000–1500 Å is deposited on the oxide on the first polysilicon layer. Following formation of the gate as described above, the second polysilicon layer is doped by, for example, implanting with phosphorous ($P^{31}$). Some of the dopant implanted in the second polysilicon layer is layer driven through the thin oxide into the first polysilicon layer.

Thin layers of polysilicon have a smaller grain size than thick layers. Since the polysilicon contacting the tunnel oxide is only 300–500 Å, the grain size of the polysilicon near the tunnel is small and uniform. The thin oxide which separates this thin polysilicon from the thicker polysilicon portion of the gate, prevents the thin polysilicon layer from forming larger grains, as could happen in a later recrystallization of a polysilicon layer equal in thickness to the combined thickness of the first and second layer of the present invention.

Since the oxide is relatively thin, dopant can be driven through it from the upper to the lower polysilicon layer to ensure proper doping of the entire thickness of the gate. In a gate formed in accordance with the present invention, the lower polysilicon layer of the gate, that is, the layer in contact with the tunnel oxide, is more lightly doped than the lower portion of a conventional gate. This contributes to smaller grain size in the lower portion of the gate formed by the present invention as it is well known that a lightly doped polysilicon layer will have a smaller grain size than a more heavily doped layer.

Because the grain size of the polysilicon in the region of the tunnel oxide is small and uniform, the required voltages to erase each cell is uniform from cell to cell in an array of such cells forming a memory device. Because of this uniformity of erase voltage, tail bits are eliminated or reduced, and yield and cycling endurance is thereby increased in the present invention.

BRIEF DESCRIPTION OF THE DRAWINGS

FIG. 1 is a cross sectional elevation view of a semiconductor substrate with a pad oxide, nitride strips and first photoresist members formed thereon during arsenic implantation.

FIG. 2 is a cross sectional elevation view of the semiconductor body of FIG. 1 with the first photoresist members removed and second photoresist members formed on alternate regions between the nitride strips, during phosphorous implantation.

FIG. 3 is a cross sectional elevation view of the semiconductor body of FIG. 2 after a field oxide has been grown in the regions between the nitride strips.

FIG. 4 is the semiconductor substrate of FIG. 3 with the nitride strips removed, during boron implantation.

FIG. 5 is the semiconductor substrate of FIG. 4 after removal of the pad oxide and with the tunnel oxide formed thereon.

FIG. 6 is a prior art semiconductor device with a floating gate formed thereon.

FIG. 7 is the semiconductor body of FIG. 5 during floating gate fabrication.

FIG. 8 is the semiconductor substrate of FIG. 7 with one dimension of the floating gate members formed thereon.

FIG. 9 is the semiconductor substrate of FIG. 8 with an oxide formed on the floating gate members and second gate members formed thereon.

DETAILED DESCRIPTION OF THE PRESENT INVENTION

A process for fabricating electrically programmable and electrically erasable floating gate memory devices is described. In the following description, numerous specific details are set forth such as specific doping levels, etc., in order to provide a thorough understanding of the present invention. It will be obvious, however, to one skilled in the art that these specific details need not be employed to practice the present invention. In other instances, well-known processing steps are not described in detail in order not to obscure unnecessarily the present invention.

The memory cells of the present invention are fabricated using standard metal-oxide-semiconductor (MOS) processing. The array which contains the cells, in the currently preferred embodiment is fabricated of n-channel devices on a p-type substrate. The peripheral circuits can employ either n-channel devices or complementary MOS (CMOS) devices. However, the present invention can also be used to fabricate an array of p-channel devices on an n-type substrate, with the peripheral circuits employing either p-channel or CMOS devices.

Although the fabrication of the floating gates of the present invention is described in conjunction with the fabrication of a particular memory array, specifically, a buried bit line contactless array, it will be appreciated that the present invention can be used to fabricate the floating gates of any type of non-volatile memory device employing floating gates. Additionally, it will be appreciated that the floating gates can be fabricated using the process of the present invention at several points during the fabrication of the completed device, for example, before or after the field oxide, before or after source/drain definition or implantation, etc., and is not necessarily restricted to the sequence described below.

Initially, the entire substrate is covered with a thin silicon dioxide ($SiO_2$) layer known as the "pad oxide" followed by a thicker silicon nitride ($Si_3N_4$) layer. Referring now to FIG. 1, a portion of the array region of a p-type monocrystalline silicon substrate 20 is illustrated covered with pad oxide 26. In this array region the silicon nitride has been etched to form elongated, parallel, spaced-apart strips 23 by using ordinary photoresist members 24 as a mask during the nitride etch. The regions 22 underlying the nitride strips 23 and photoresist members 24 are protected when the regions between the strips 23 are implanted with arsenic as indicated by the arrows 25. In the presently preferred embodiment, arsenic is implanted to a level of $1 \times 10^{15}/cm^2$ to $5 \times 10^{15}/cm^2$. This forms elongated, parallel, spaced-apart doped regions in the substrate. After the arsenic is implanted, photoresist members 24 are removed.

Next, as illustrated in FIG. 2, alternate ones of the elongated regions between the nitride members 23 (such as region 28) are covered with a photoresist members 30. The regions 28 are thus protected by photoresist members 30 while the regions 22 remain protected by the nitride strips 23. The elongated regions 27 are exposed and are implanted with an n-type dopant. The regions 27 in the currently preferred embodiment are doped with phosphorus to a level of approximately $0.2 \times 10^{15}/cm^2$ to $0.8 \times 10^{15}/cm^2$.

Another doping step (not illustrated) may be used to enhance programming for low voltage operation. After the photoresist members 30 are removed, additional masking members may be formed exposing regions 28 (drain regions).

Now the substrate is subjected to a high temperature (800° C.–900° C.) oxidation step. Relatively thick field oxide regions are grown over the elongated doped regions 27 and 28 forming the oxide regions 32 shown in FIG. 3. In the currently preferred embodiment, these oxide regions are approximately 2000 angstroms thick. Note the nitride members 23 prevent the formation of oxide in the regions 22. The high temperature oxidation step activates the arsenic and phosphorus dopants forming the source regions 34 (at the regions 27) and drain regions 35 (at regions 28). Note, as shown in FIG. 3, the source regions 34 are deeper than the drain regions 35. The phosphorus dopant diffuses more quickly into the silicon than arsenic, thus making these regions deeper. Moreover, the dopant gradient associated with the source regions are more gradual (graded) than that associated with the drain regions.

After the silicon nitride members 23 are removed by conventional techniques, the substrate, with pad oxide, is subjected to a threshold voltage adjusting implant. Referring to FIG. 4, boron, as indicated by lines 36, is implanted to a level of approximately $1 \times 10^{13}/cm^2$. The channel implant may consist of a combination of low energy and high energy boron implants.

After pad oxide 26 is removed using conventional techniques, a sacrificial oxide layer may be grown and removed from the regions 22 to prepare them for the tunnel oxide growth. In the currently preferred embodiment, tunnel oxide 39 is grown in a conventional furnace at approximately 920° C. to a thickness of approximately 110 angstroms. FIG. 5 shows the substrate with tunnel oxide 39 formed thereon.

Referring to FIG. 6, a prior art, single polysilicon layer gate 38 is shown. Region 50 is the area through which electrons will tunnel through tunnel oxide 39 from floating gate 38 to source 34. The grain size and orientation of the polysilicon of floating gate 38 in region 50 will affect the voltage which must be applied to source 34 in order to erase floating gate 38.

If the polysilicon grains are oriented such that sharp points or edges are pointed towards the tunnel oxide 39, the electric field in the localized region 50 for a given voltage applied to source 34 will be increased. Therefore, electrons will tunnel through tunnel oxide 39 at lower voltages. If the grains are oriented such that there are no points or edges pointing into tunnel oxide 39, that is, if the grains are oriented in a horizontal direction, the electric field in the localized region 50 for a given voltage will be decreased, and a higher voltage is then required in order to cause electrons to tunnel from floating gate 38 to source 34 during erase.

If the polysilicon grains of floating gate 38 are large, the effect will vary greatly from gate to gate in an array. In large polysilicon grains, the electric field is greater near sharp points than near the points of small grains. Additionally, in a floating gate with large grains, there will be fewer grains in region 50 than in the gate with small grains. Therefore, the orientation of the grains in this region will have a large effect on the voltage required to erase that gate. Gates with all or nearly all of the grains in region 50 pointed towards tunnel oxide 39 will erase at low voltages, while gates with all or nearly all grains in region 50 lying along tunnel oxide 39 will erase at high voltages. Gates with some grains pointed towards 39 and others lying along the gate/tunnel oxide interface will erase at intermediate voltages. For a given erase voltage, the variations in grain size and orientation will cause the cells in an array to be erased at different speeds from one another.

Conversely, in a gate with small polysilicon grains, the orientation of the grains has less effect, as the increase in the electric field near sharp points in small grains is not as great as with large grains. Also, since there will be many such grains in region 50, it will be much less likely for all or nearly all of the grains in the region to be pointed towards tunnel oxide 39 or for all or nearly all of the grains to be pointed away from tunnel oxide 39. The grains will be oriented randomly with sharp points and edges oriented in all directions. The result is that the voltage required to erase a gate with small grain size will fall somewhere between that required for a gate with large grains pointed towards the tunnel oxide 39 and the voltage required for a gate with large grains size all oriented along the tunnel oxide/polysilicon interface.

Therefore, if no effort is made to control the grain size of the polysilicon in floating gate 38 of FIG. 6, the erase voltage will vary greatly from gate to gate in an array. Some will have large grains with points oriented towards tunnel oxide 39 and will therefore erase quickly at a given voltage, others will have large grains oriented along the tunnel oxide 39/floating gate 38 interface and will erase more slowly and therefore have a long erase time.

This variation in grain size from gate to gate has important effects on device yield and performance. A measurement of device performance is the threshold voltage. The threshold voltage is the voltage that must be applied to the control gate while the drain is held at low voltage to cause 1 microamp of current to be read at the drain. In a distribution of threshold voltages for an array, those gates with low threshold voltages are known as "tail bits". These tail bits limit yield as a gate with a threshold voltage below a certain value, for example 2 volts, may experience high leakage current, that is, the erasure of the floating gate with very low voltage applied to the source. In addition, the cycling endurance—the ability of a cell in an array to remain functional after repeated programming and erase cycles—is adversely affected. It is well know that the threshold voltage will decrease after repeated cycles of program and erase. Therefore, a memory device with a wide distribution of tail bits will have many cells fail during cycling as the threshold voltage of these tail bits falls below the voltage necessary for proper functioning.

In the floating gate of the present invention, the grain size of the polysilicon is small and uniform from gate to gate. This greatly reduces the variation in threshold voltage after erase from gate to gate due to polysilicon grain size and/or orientation variations, and results in a tighter erase distribution of threshold voltages. Therefore, tail bits with threshold voltages below the required value or which will fail after cycling are greatly reduced.

Erase time in the present invention is improved as well. In prior art devices, the tunnel oxide 39 cannot be made too thin as this would cause many of the gates with large grains oriented towards tunnel oxide 39 to have too low a threshold voltage. A thicker tunnel oxide 31 however, results in longer erase time. In the present invention, since the grain size is small and uniform from gate to gate, the tunnel oxide 39 thickness can be optimized for short erase time without excessive yield loss due to cells with low threshold voltage.

FIG. 7 illustrates the construction of the floating gate of the present invention. Although the gate is shown being constructed after field oxide 32 has been formed, the gate can be constructed before fabrication of field oxide 32 or, the field oxide 32 can be fabricated during the fabrication of the floating gate described below.

First, thin polysilicon layer 45 of FIG. 7 is deposited using conventional techniques. The thickness of polysilicon layer 45 in the currently preferred embodiment is approximately 300–500 Å and may be in the range of approximately 200 to 700 Å. As mentioned previously, the grain size of polysilicon is limited by layer thickness. Because the thickness of thin polysilicon layer 45 is only about 20% of the thickness of the total polysilicon thickness of the floating gate in the currently preferred embodiment, the maximum grain size of the crystals in this layer is much smaller than for a gate of the same total polysilicon thickness formed from a single polysilicon layer. Since this is the portion of the gate in contact with tunnel oxide 39, the grain size near tunnel oxide 39 is, therefore, much smaller than in prior art devices and confined to a narrower distribution.

Next, thin oxide layer 46 of FIG. 7 is grown on thin polysilicon layer 45 using conventional techniques. For example, thin oxide layer 46 may be grown through a low temperature (700°–800° C.) $N_2$ anneal or by leaving thin polysilicon layer 45 exposed to air at room temperature for a short period. The thickness of thin oxide layer 46 in the currently preferred embodiment is approximately 20–30 Å and may be in the range of approximately 15-50 Å. The thickness of thin oxide layer 46 must be great enough to prevent thin polysilicon layer 45 from recrystallizing in conjunction with a subsequently deposited layer of polysilicon (described below) during later high temperature processing. However, thin oxide layer 46 must be thin enough to allow dopant implanted in the subsequent polysilicon layer to be driven through it to thin polysilicon layer 45. If thin oxide layer is in the range of 15-50 Å mentioned above, it will meet both of these requirements. In an alternative embodiment, the present invention can be practiced by depositing a thin nitride ($Si_3N_4$) layer of approximately 15-50 Å in place of thin oxide layer 46.

Thick polysilicon layer is then deposited on thin oxide layer 46 using conventional techniques. The thickness of thick polysilicon layer 47 in a currently preferred embodiment is approximately 1000-1500 Å but may be in the range of approximately 800-2000 Å, depending on the total desired thickness of the floating gate.

The substrate of FIG. 7 is then patterned and etched using conventional techniques to form one dimension of the floating gate. Elongated, parallel, spaced-apart strips 38a are formed from the layers 45, 46 and 47 over the channel regions 22 as shown in FIG. 8. The strips 38a extend beyond the regions 22 and overlap the oxide regions 32.

Following the patterning and etch, strips 38a are implanted with a dopant using conventional techniques. The dopant may be any of the conventional prior art dopants. In the currently preferred embodiment strips 38a are implanted with phosphorous ($P^{31}$) to a level in the range of approximately $1 \times 10^{14}/cm^2 - 8 \times 10^{14}/cm^2$. The implantation is carried out at an energy in the range of approximately 20-40 keV. The dopant can be driven in during later high temperature processing or can be done in a separate diffusion step. As mentioned previously, thin oxide layer 46 is thin enough such that during the diffusion step, dopant will diffuse through the thin oxide layer 46 to thin polysilicon layer 45. Thin polysilicon layer 45 can be doped in this manner to an appropriate level for proper device functioning. However, the dopant in this layer will generally be less than in a corresponding portion of the prior art floating gate 38 shown in FIG. 6. It is well known that polysilicon which is heavily doped forms larger grain size than polysilicon which is lightly doped after subsequent high temperature processing steps. Therefore, in the present invention the light doping of thin polysilicon layer 45 further reduces the grain size of the polysilicon of thin polysilicon layer 45. Therefore, the portion of strip 38a formed from thin polysilicon layer 45, that is, the polysilicon nearest tunnel oxide 39, has small grain size resulting both from the thinness of this layer as well as its light doping.

Now an oxide layer 41 is deposited over the polysilicon strips 38a. In the currently preferred embodiment, oxide layer 41 is a multi-layer structure comprised of a first oxide layer, a silicon nitride layer and a second oxide layer (ONO). Following formation of oxide layer 41 a second layer of polysilicon is deposited on the substrate. This second polysilicon layer is etched to form elongated, parallel, spaced-apart polysilicon strips which are generally perpendicular to the source and drain regions. The elongated strips 38a formed from layers 45, 46 and 47 are now etched in alignment with the strips 42, thereby forming a plurality of floating gates 38b.

Metal layers and contacts are formed by well known methods to complete the memory.

The cells are programmed by applying a voltage to the drain regions 35 of 4-7 volts while the control gates (lines 42) are brought to a relatively high voltage (10-15 volts). To erase the floating gates 38b, that is, to tunnel the charge from the floating gate 38b to the source 34, a high voltage (10-15 volts) is applied to the source regions 34 while the drain regions 35 are floating and control gates 42 are grounded. For a more complete discussion of the erasing of such devices see U.S. Pat. No. 4,797,856.

With the above described processing, the floating gates 38b of the present invention have small, uniform grains in the region of the floating gate 38b/tunnel oxide 39 interface. This in turn leads to a narrow distribution of tail bits, thus improving yield and cycling endurance.

Thus, a novel floating gate with small and uniform grain size for an electrically erasable and electrically programmable read-only memory cell is described.

We claim:

1. A floating gate member in a non-volatile memory device, comprising:
   a first polysilicon layer disposed on a tunnel oxide, said first polysilicon layer forming a first portion of said floating gate member;
   an insulative layer disposed on said first polysilicon layer, said insulative layer forming a second portion of said floating gate member; and
   a second polysilicon layer disposed on said insulative layer, said second polysilicon layer forming a third portion of said floating gate member, wherein said second polysilicon layer has a dopant concentration of approximately $1 \times 10^{20}$ ions/cm$^3$ or less, and wherein said second polysilicon layer is doped to a greater concentration than said first polysilicon layer.

2. The floating gate member as defined in claim 1 wherein said first polysilicon layer is in the range of 200-700 Å and the thickness of said second polysilicon layer is in the range of 800-2000 Å.

3. The floating gate member as defined in claim 1 wherein the thickness of said insulative layer is in the range of 15-50 Å.

4. The floating gate member as defined in claim 2 wherein the thickness of said insulative layer is in the range of 15-50 Å.

5. The floating gate member as defined in claim 1, 2, 3 or 4 wherein said insulative layer comprises silicon dioxide.

6. An array of floating gate memory devices, each of said devices comprising a floating gate member, said floating gate member comprising:
   a first polysilicon layer disposed on a tunnel oxide layer, said first polysilicon layer forming a first portion of said floating gate member;
   an insulative layer disposed on said first polysilicon layer, said insulative layer forming a second portion of said floating gate member; and
   a second polysilicon layer disposed on said insulative layer, said second polysilicon layer forming a third portion of said floating gate member, wherein said second polysilicon layer has a dopant concentration of approximately $1 \times 10^{20}$ ions/cm$^3$ or less, and wherein said second polysilicon layer is doped to a greater concentration than said first polysilicon layer.

7. The array as defined in claim 6 wherein said first polysilicon layer is in the range of 200–700 Å and the thickness of said second polysilicon layer is in the range of 800–2000 Å.

8. The array as defined in claim 6 wherein the thickness of said insulative layer is in the range of 15–50 Å.

9. The array as defined in claim 7 wherein the thickness of said insulative layer is in the range of 15–50 Å.

10. The array as defined in claim 6, 7, 8 or 9 wherein said insulative layer comprises silicon dioxide.

11. The array as defined in claim 6 wherein the grain size of said first polysilicon layer is uniform in all of said floating gates.

12. The array as defined in claim 7 wherein the grain size of said first polysilicon layer is uniform in all of said floating gates.

13. The array as defined in claim 8 wherein the grain size of said first polysilicon layer is uniform in all of said floating gates.

14. The array as defined in claim 9 wherein the grain size of said first polysilicon layer is uniform in all of said floating gates.

15. The array as defined in claim 10 wherein the grain size of said first polysilicon layer is uniform in all of said floating gates.

16. The array as defined in claim 6 wherein the grain size of said first polysilicon layer is uniform in all of said floating gates.

* * * * *